(12) United States Patent
Kuroda

(10) Patent No.: US 10,902,888 B2
(45) Date of Patent: Jan. 26, 2021

(54) SENSE AMPLIFIER, SEMICONDUCTOR STORAGE DEVICE, INFORMATION PROCESSING APPARATUS, AND READING METHOD

(71) Applicant: Sony Semiconductor Solutions Corporation, Kanagawa (JP)

(72) Inventor: Masami Kuroda, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/489,140

(22) PCT Filed: Feb. 5, 2018

(86) PCT No.: PCT/JP2018/003823
§ 371 (c)(1),
(2) Date: Aug. 27, 2019

(87) PCT Pub. No.: WO2018/159225
PCT Pub. Date: Sep. 7, 2018

(65) Prior Publication Data
US 2019/0392873 A1 Dec. 26, 2019

(30) Foreign Application Priority Data
Mar. 3, 2017 (JP) ................. 2017-040740

(51) Int. Cl.
*G11C 7/00* (2006.01)
*G11C 7/08* (2006.01)
*G11C 13/00* (2006.01)

(52) U.S. Cl.
CPC ............. *G11C 7/08* (2013.01); *G11C 13/004* (2013.01); *G11C 13/0038* (2013.01); *G11C 2013/0045* (2013.01); *G11C 2013/0054* (2013.01)

(58) Field of Classification Search
CPC ....... G11C 11/4091; G11C 7/065; G11C 7/06; G11C 11/4097; G11C 7/12
USPC .......................... 365/205, 206, 207
See application file for complete search history.

(56) References Cited

U.S. PATENT DOCUMENTS

| 6,754,121 B2* | 6/2004 | Worley ................. G11C 7/065 365/154 |
| 8,982,610 B2* | 3/2015 | Harris .................. G11C 11/419 365/156 |
| 2013/0148429 A1* | 6/2013 | Kim ..................... G11C 11/161 365/185.18 |

FOREIGN PATENT DOCUMENTS

| JP | 2001-273756 A | 10/2001 |
| JP | 2002-367364 A | 12/2002 |
| JP | 2009-76137 A | 4/2009 |
| JP | 2009-238327 A | 10/2009 |

* cited by examiner

*Primary Examiner* — Son T Dinh
(74) *Attorney, Agent, or Firm* — Michael Best & Friedrich LLP

(57) ABSTRACT

To provide a sense amplifier which is capable of implementing a large capacity, a high speed, and an increased data rate of a semiconductor storage device.

A sense amplifier is provided, the sense amplifier including: first and second inverters including switches configured to control an activation state and an inactivation state, and having inputs and outputs cross-coupled to each other, respectively; and first and second switches configured to switch between connection and disconnection of each of the cross-coupled first and second inverters with respect to an input from a storage element.

18 Claims, 11 Drawing Sheets

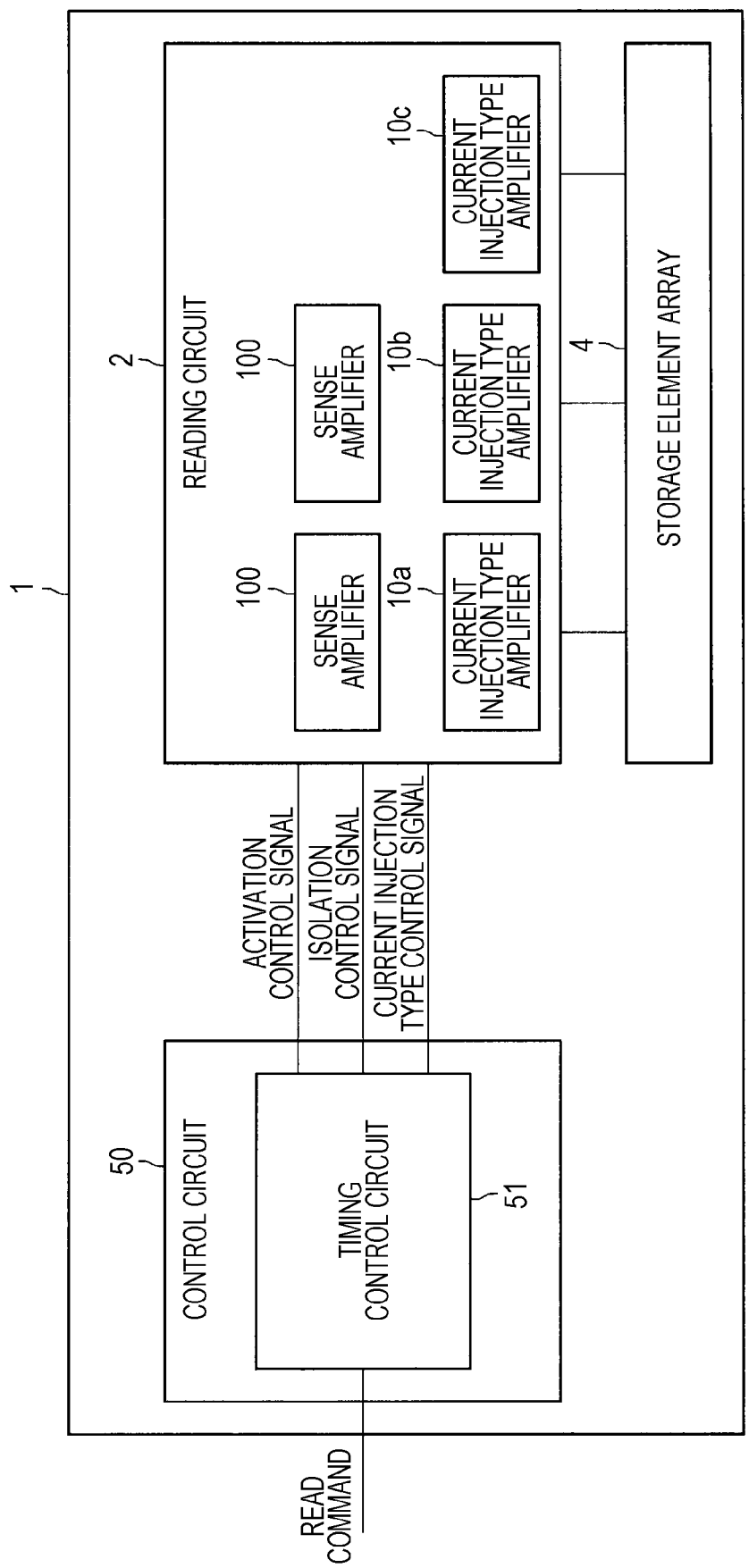

SENSE AMPLIFIER, SEMICONDUCTOR STORAGE DEVICE, INFORMATION PROCESSING APPARATUS, AND READING METHOD

TECHNICAL FIELD

The present disclosure relates to a sense amplifier, a semiconductor storage device, an information processing apparatus, and a reading method.

BACKGROUND ART

A variable-resistance semiconductor storage device includes a storage element constituted by at least one variable-resistance storage element which stores at least binary information on the basis of an electric resistance value. Further, the variable-resistance semiconductor storage device flows a current to a selected storage element and detects a value of a voltage applied to an electrical resistor of the storage element, by using a sense amplifier, to read a logical value stored in the storage element. In addition, the storage element of the variable-resistance semiconductor storage device has characteristics that when a voltage of a threshold or more is applied, a change to a high resistance or a low resistance occurs according to a direction of the applied voltage. Therefore, the variable-resistance semiconductor storage device requires reading at a voltage no higher than the threshold voltage, and thus a sense amplifier with excellent sensitivity and high performance is required. A document disclosing such a semiconductor storage device includes, for example, Patent Documents 1 to 4, or the like.

CITATION LIST

Patent Document

Patent Document 1: Japanese Patent Application Laid-Open No. 2009-238327
Patent Document 2: Japanese Patent Application Laid-Open No. 2009-76137
Patent Document 3: Japanese Patent Application Laid-Open No. 2001-273756
Patent Document 4: Japanese Patent Application Laid-Open No. 2002-367364

SUMMARY OF THE INVENTION

Problems to be Solved by the Invention

Implementation of a large capacity, a high speed, and an increased data rate of the variable-resistance semiconductor storage device have been hindered in the existing technology.

Therefore, the present disclosure suggests a novel and improved sense amplifier which is capable of implementing a large capacity, a high speed, and an increased data rate of a semiconductor storage device, the semiconductor storage device, an information processing apparatus, and a reading method.

Solutions to Problems

According to the present disclosure, a sense amplifier is provided, the sense amplifier including: first and second inverters including switches configured to control an activation state and an inactivation state, and having inputs and outputs cross-coupled to each other, respectively; and first and second switches configured to switch between connection and disconnection of each of the cross-coupled first and second inverters with respect to an input from a storage element.

Furthermore, according to the present disclosure, a semiconductor storage device is provided, the semiconductor storage device including: a memory element; a first reference element set to be in a first resistance state when generating a reference potential used to read data from the memory element; a second reference element set to be in a second resistance state when generating the reference potential, the second resistance state being different from the first resistance state and the second reference element being different from the first reference element; and a sense amplifier configured to detect a difference between inputs from the memory element, and the first and second reference elements which are selected, in which the sense amplifier includes first and second inverters including switches configured to control an activation state and an inactivation state, and having inputs and outputs cross-coupled to each other, respectively; and first and second switches configured to switch between connection and disconnection of each of the cross-coupled first and second inverters with respect to the inputs from the memory element and the first and second reference elements.

Furthermore, according to the present disclosure, an information processing apparatus including at least one semiconductor storage device described above is provided.

Furthermore, according to the present disclosure, a reading method is provided, the reading method including: switching between connection and disconnection of each of first and second inverters with respect to an input from a storage element by using first and second switches, the first and second inverters including switches configured to control an activation state and an inactivation state, and having inputs and outputs cross-coupled to each other, respectively.

Effects of the Invention

As described above, according to the present disclosure, it is possible to provide the novel and improved sense amplifier which is capable of implementing a large capacity, a high speed, and an increased data rate of the semiconductor storage device, the semiconductor storage device, the information processing apparatus, and the reading method.

Note that effects of the present disclosure are not necessarily limited to the effects described above, and, along with or instead of the effects described above, any of the effects shown in the present specification, or other effects that can be grasped from the present specification may be achieved.

BRIEF DESCRIPTION OF DRAWINGS

FIG. 9 is an explanatory diagram illustrating an example of a functional configuration of the semiconductor storage device according to the embodiment.

MODE FOR CARRYING OUT THE INVENTION

Figure 1:
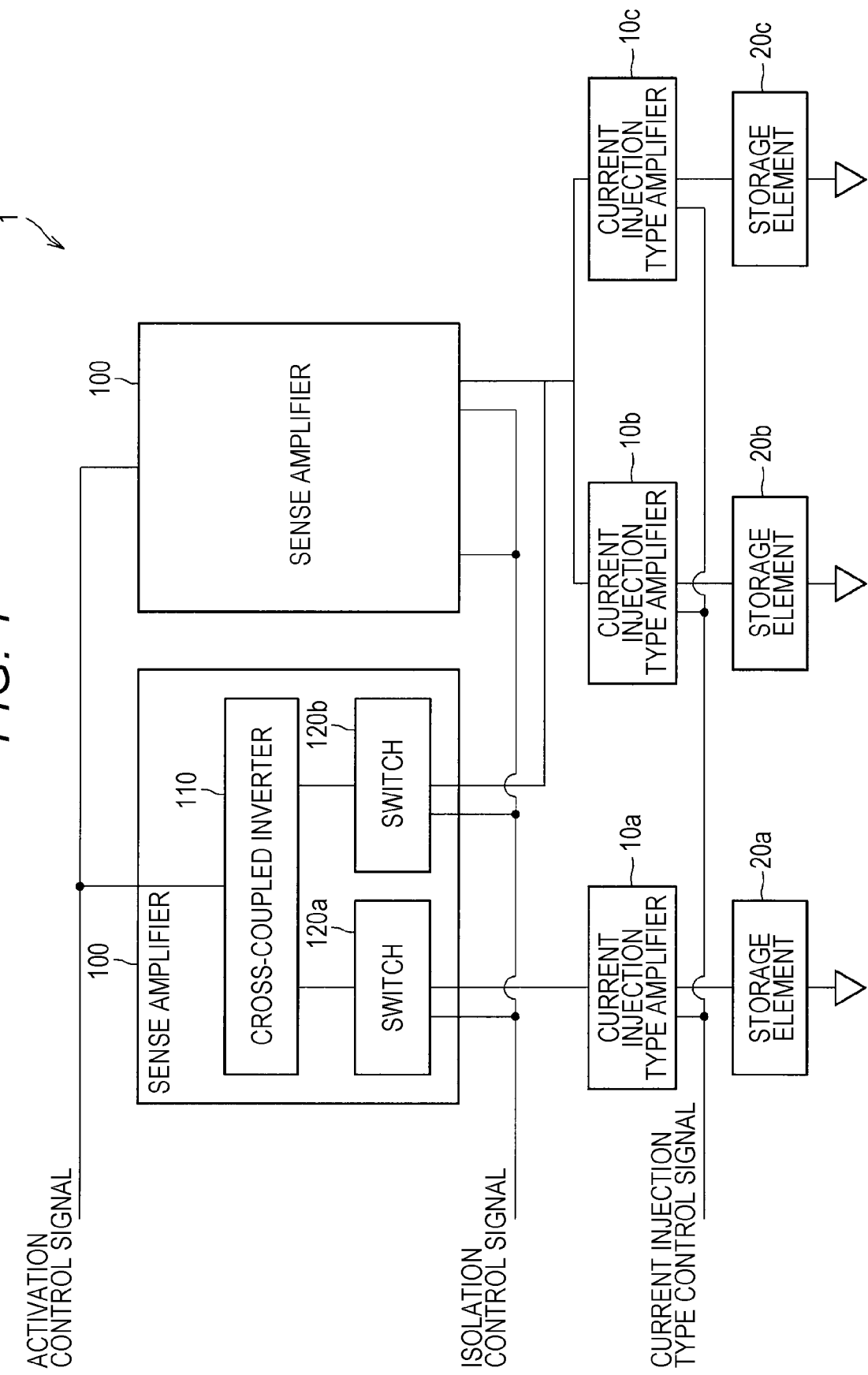
FIG. 1 is an explanatory diagram illustrating an example of a functional configuration of a semiconductor storage device according to an embodiment of the present disclosure.

Hereinafter, a preferred embodiment of the present disclosure will be described in detail with reference to the accompanying drawings. Note that in the present specification and the drawings, components having substantially the same functional configuration will be denoted by the same reference numerals, and redundant description will be omitted.

Note that descriptions will be provided in the following order.

1. Embodiment of Present Disclosure
1.1. Overview
1.2. Example of Configuration
2. Example of Application
3. Summary

1. EMBODIMENT OF PRESENT DISCLOSURE 1.1. Overview

Before describing an embodiment of the present disclosure in detail, an overview of the embodiment of the present disclosure will be provided.

A variable-resistance semiconductor storage device includes a storage element constituted by at least one variable-resistance storage element which stores at least binary information on the basis of an electric resistance value. Further, the variable-resistance semiconductor storage device flows a current to a selected storage element and detects a value of a voltage applied to an electrical resistor of the storage element, by using a sense amplifier, to read a logical value stored in the storage element. In addition, the storage element of the variable-resistance semiconductor storage device has characteristics that when a voltage of a threshold or more is applied, a change to a high resistance or a low resistance occurs according to a direction of the applied voltage. Therefore, the variable-resistance semiconductor storage device requires reading at a voltage no higher than the threshold voltage, and thus a sense amplifier with excellent sensitivity and high performance is required.

In order to identify a resistance value of the storage element, a method in which a storage element for reference which has an intermediate value of two resistance values (a high resistance and a low resistance) is prepared is used. In this method, there is a need to manufacture storage elements separately, such that manufacturing costs increase. In this regard, a method of connecting variable-resistance storage elements having a plurality of resistance values to each other in parallel and obtaining an average value of the resistance values to generate a potential for reference has been suggested.

If the method of connecting a plurality of variable-resistance storage elements to each other in parallel and obtaining an average value thereof as a potential for reference is used, there is no need to separately manufacture the storage elements. However, in a case of using this method, there is a need to make load capacities of reading current application paths of a storage element for data storage and the storage element for reference equivalent to each other. Therefore, since the number of storage elements for reference cannot be reduced and the number of storage elements for data storage cannot be increased in a determined area, implementation of a high capacity is hindered.

Further, Patent Document 3 discloses a technology of a sense amplifier which detects a voltage value of a storage element. In the sense amplifier disclosed in Patent Document 3, the number of storage elements connected to a sense node and the number of storage elements connected to a reference node are equivalent to each other. Therefore, it is possible to generate a differential voltage in a sample period. However, in a case where the storage element for reference is shared by a plurality of sense amplifiers activated at the same time, a capacity load of the plurality of sense amplifiers is applied to the reference node, and as a result, a balance in capacity between the reference node and the sense node cannot be achieved. In other words, a voltage appearing on the sense node flows to the reference node, such that a differential voltage does not appear. Therefore, in Patent Document 3, the sense amplifier is exclusively controlled in a case where the storage element for reference is shared by the plurality of sense amplifiers. However, since the sense amplifier is exclusively controlled, it is not possible to parallelize reading, such that it is not possible to increase a data rate.

Therefore, in light of the point described above, the present discloser has diligently studied a technology capable of implementing a large capacity, a high speed, and an increased data rate of a semiconductor storage device. As a result, the present discloser has come to devise a technology capable of implementing a large capacity, a high speed, and an increased data rate of a semiconductor storage device, as will be described later.

Hereinabove, the overview of the embodiment of the present disclosure has been described.

1.2. Example of Configuration

First, an example of a functional configuration of a semiconductor storage device according to the embodiment of the present disclosure will be described. FIG. 1 is an explanatory diagram illustrating the example of the functional configuration of the semiconductor storage device according to the embodiment of the present disclosure. Hereinafter, the example of the functional configuration of the semiconductor storage device according to the embodiment of the present disclosure will be described with reference to FIG. 1.

A semiconductor storage device 1 illustrated in FIG. 1 includes current injection type amplifiers 10a, 10b, and 10c, storage elements 20a, 20b, and 20c, and a sense amplifier 100.

When reading data from the storage element 20a, the current injection type amplifier 10a injects a current into the storage element 20a to amplify an output from the storage element 20a and outputs the amplified output to the sense amplifier 100. The current injection type amplifier 10a outputs, to the sense amplifier 100, a high-level output in a case where a resistance state of the storage element 20a is a high resistance (RH), and a low level output in a case where the resistance state of the storage element 20a is a low resistance (RL).

When reading data from the storage element 20a, the current injection type amplifiers 10b and 10c inject a current into the storage elements 20b and 20c to amplify outputs from the storage elements 20b and 20c and output the amplified outputs to the sense amplifier 100. The outputs from the storage elements 20b and 20c are used to read the data from the storage element 20a. Configurations of the current injection type amplifiers 10a, 10b, and 10c will be described later, and the current injection type amplifiers 10a, 10b, and 10c are each constituted by a constant current source and a transistor for voltage clamp.

The storage elements 20a, 20b, and 20c each include at least one variable-resistance storage element which stores at least binary information on the basis of an electric resistance value. The storage element 20a is a storage element for data storage, and the storage elements 20b and 20c are storage elements for reference. One of the storage elements 20b and 20c is a storage element in which a logical value "0" is written, and the other one of the storage elements 20b and 20c is a storage element in which a logical value "1" is written. The storage elements 20b and 20c are connected to each other in parallel, such that an average of values of the storage elements 20b and 20c is used as a reference.

The sense amplifier 100 compares the output from the storage element 20a and an average of the outputs from the storage elements 20b and 20c with each other, and amplifies and outputs a comparison result. The sense amplifier 100 is activated by an activation control signal from a memory controller (not illustrated). In the present embodiment, the sense amplifier 100 includes a cross-coupled inverter 110 and switches 120a and 120b.

A detailed configuration of the cross-coupled inverter 110 will be described later, and in the cross-coupled inverter 110, two P-type transistors and two N-type transistors construct a cross latch. Furthermore, the cross-coupled inverter 110 includes transistors which are connected to the transistors constructing the cross latch in series, respectively, and control supply of power.

The switch 120a is a switch configured to switch between connection and disconnection between the current injection type amplifier 10a and the cross-coupled inverter 110. Furthermore, the switch 120b is a switch configured to switch between connection and disconnection between the current injection type amplifiers 10b and 10c, and the cross-coupled inverter 110. The switches 120a and 120b are turned on and off according to an isolation control signal from the memory controller (not illustrated).

Hereinabove, the example of the functional configuration of the semiconductor storage device according to the embodiment of the present disclosure has been described. Next, a specific example of a circuit configuration of the semiconductor storage device according to the present embodiment will be described.

Figure 2:
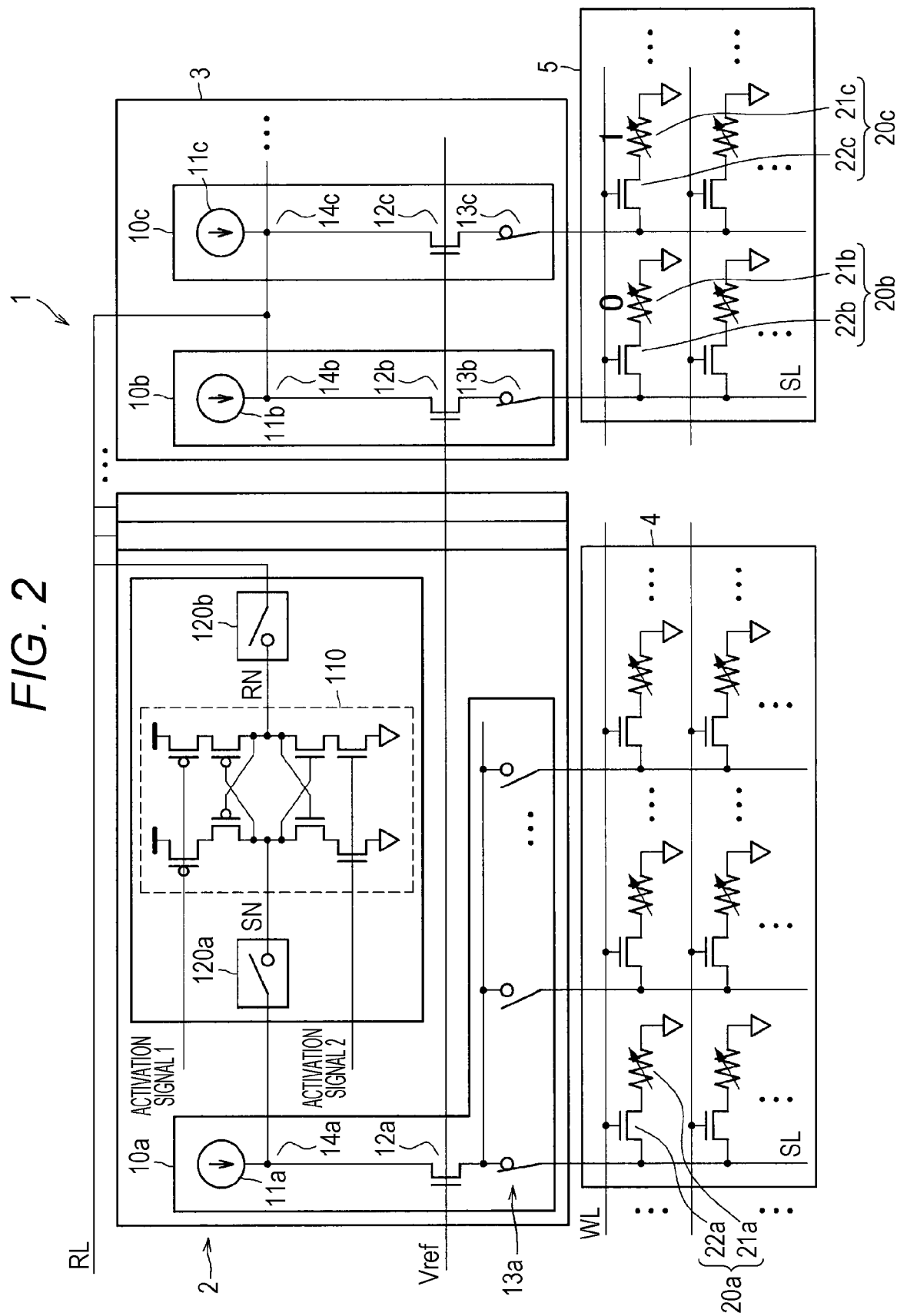
FIG. 2 is an explanatory diagram illustrating an example of a circuit configuration of the semiconductor storage device according to the embodiment.

FIG. 2 is an explanatory diagram illustrating an example of a circuit configuration of the semiconductor storage device according to the present embodiment. Hereinafter, the example of the circuit configuration of the semiconductor storage device according to the present embodiment will be described with reference to FIG. 2.

The semiconductor storage device 1 illustrated in FIG. 2 includes a reading circuit 2, a reference generating circuit 3, a memory cell array 4, and a reference cell array 5.

The reading circuit 2 includes the current injection type amplifier 10a and the sense amplifier 100. The current injection type amplifier 10a includes a constant current source 11a and a transistor 12a for voltage clamp. The transistor 12a for voltage clamp is controlled by a predetermined reference voltage Vref so as to limit a voltage applied to the storage element 20a. Furthermore, the reading circuit 2 includes 1/N switches 13a configured to switch between connection and disconnection between a reading line 14a and a source line SL of the memory cell array 4, the reading line 14a extending from the constant current source 11a. A plurality of reading circuits 2 can be provided.

The reference generating circuit 3 includes the current injection type amplifiers 10b and 10c. The current injection type amplifier 10b includes a constant current source 11b and a transistor 12b for voltage clamp. The current injection type amplifier 10c includes a constant current source 11c and a transistor 12c for voltage clamp. The transistors 12b and 12c for voltage clamp are controlled by the predetermined reference voltage Vref so as to limit a voltage applied to the storage elements 20b and 20c.

Furthermore, the reference generating circuit 3 includes a replica switch 13b configured to switch between connection and disconnection between a reading line 14b and a source line SL of the reference cell array 5, the reading line 14b extending from the constant current source 11b. Furthermore, the reference generating circuit 3 includes a replica switch 13c configured to switch between connection and disconnection between a reading line 14c and a source line SL of the reference cell array 5, the reading line 14c extending from the constant current source 11c. The same number of replica switches as the storage elements for reference activated at the same time are provided. In addition, the same number of replica switches as the current injection type amplifiers are provided. Outputs from the current injection type amplifiers 10b and 10c are coupled to one reference line RL to be connected to the plurality of reading circuits 2 activated at the same time.

The 1/N switches 13a and the replica switches 13b and 13c are each controlled to be in a connected state at the time of a reading operation, and to be in a disconnected state at the time of operations other than the reading operation.

The memory cell array 4 includes the storage elements 20a arranged in a matrix form. The storage element 20a includes a variable-resistance storage element 21a and a selection transistor 22a connected to the variable-resistance storage element 21a in series. The selection transistor 22a has a gate connected to a row selection line WL, a source connected to the source line SL, and a drain connected to the variable-resistance storage element 21a.

The reference cell array 5 includes the storage elements 20b and 20c arranged in a matrix form. The storage element 20b includes a variable-resistance storage element 21b and a selection transistor 22b connected to the variable-resistance storage element 21b in series. The selection transistor 22b has a gate connected to the row selection line WL, a source connected to the source line SL, and a drain connected to the variable-resistance storage element 21b. Similarly, the storage element 20c includes a variable-resistance storage element 21c and a selection transistor 22c connected to the variable-resistance storage element 21c in series. The selection transistor 22c has a gate connected to the row selection line WL, a source connected to the source line SL, and a drain connected to the variable-resistance storage element 21c.

In the present embodiment, it is assumed that a logical value "0" is written in the variable-resistance storage element 21b and a logical value "1" is written in the variable-resistance storage element 21c.

Note that the selection transistor and the variable-resistance storage element may be connected to each other in reverse to that illustrated in FIG. 2. Furthermore, a configuration in which the selection transistor is excluded by controlling a potential of the row selection line WL to become a ground at the time of selecting the storage element may be adopted.

The sense amplifier 100 includes the cross-coupled inverter 110 and the switches 120a and 120b. The cross-coupled inverter 110 includes two P-type transistors Tr1 and Tr2, two N-type transistors Tr3 and Tr4, and transistors Tr5 to Tr8, the transistors Tr5 to Tr8 controlling supply of power to each of the transistors forming the cross latch. The switch 120a is a switch for connecting or isolating a sense node SN to or from an output of the current injection type amplifier 10a, and is formed by, for example, a transistor. The switch 120b is a switch for connecting or isolating a reference node RN to or from outputs of the current injection type amplifiers 10b and 10c, and is formed by, for example, a transistor.

Hereinabove, the example of the circuit configuration of the semiconductor storage device 1 according to the present embodiment has been described with reference to FIG. 2. Next, an example of an operation of the semiconductor storage device 1 illustrated in FIG. 2 will be described.

Figure 3:
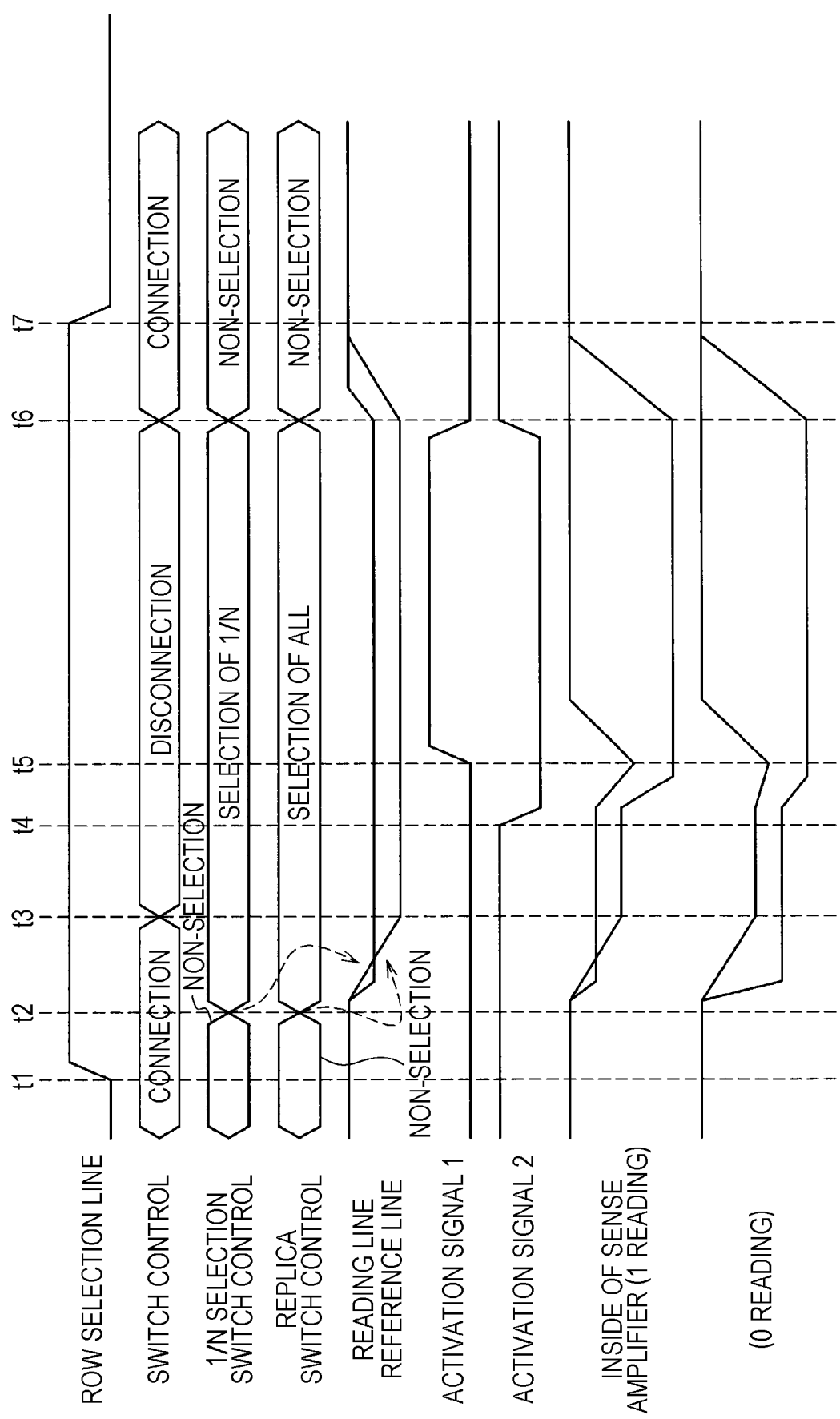
FIG. 3 is an explanatory diagram illustrating an example of an operation of the semiconductor storage device illustrated in FIG. 2 in a form of a timing chart.

FIG. 3 is an explanatory diagram illustrating the example of the operation of the semiconductor storage device 1 illustrated in FIG. 2 in a form of a timing chart.

The semiconductor storage device 1 causes any one of the 1/N switches 13a, and the replica switches 13b and 13c to be in the connected state at a timing of time t2 in a case where any row selection line WL is selected and becomes a high level at a timing of time t1. When any one of the 1/N switches 13a is brought into the connected state, a storage element 20a as a reading target is selected among the storage elements 20a selected by the row selection line WL in the high level. Furthermore, when the replica switches 13b and 13c are brought into the connected state, the storage elements 20b and 20c for reference are selected.

The 1/N switch 13a is brought into the connected state, such that the current injection type amplifier 10a can have a current path through the selected storage element 20a. A voltage value of the reading line 14a is a voltage value according to a state of the storage element 20a as the reading target.

Furthermore, as the replica switches 13b and 13c are brought into the connected state, the current injection type amplifiers 10b and 10c can have a current path through the selected storage elements 20b and 20c. A voltage value of the reference line RL is an average value of voltage values according to states of the respective storage elements 20b and 20c as reading targets. A period between time t2 to time t3 is called a sense period.

In the sense amplifier 100 of the semiconductor storage device 1 according to the present embodiment, sources of the transistors of the cross latch portion are independent during the sense period. Accordingly, a charge exchange through the sources of the transistors of the cross latch portion does not occur during the sense period. Therefore, in the sense amplifier 100 of the semiconductor storage device 1 according to the present embodiment, there is no need to match up a capacity load of the reading line 14a with a capacity load of the reference line RL. Since there is no need to match up the capacity load of the reading line 14a with the capacity load of the reference line RL, the plurality of sense amplifiers 100 activated at the same time can share the reference line RL.

When the sense period ends at time t3, the semiconductor storage device 1 performs a control of isolating the switches 120a and 120b. This is to make the capacity load of the sense node SN and the capacity load of the reference node RN uniform.

Thereafter, the semiconductor storage device 1 makes an activation signal become a low level at time t4, and makes an activation signal become a high level at time t5. By doing so, the voltage value obtained from the reading line 14a and the voltage value obtained from the reference line RL in the sense amplifier 100 are amplified. Further, the semiconductor storage device 1 can read a difference between the voltage value obtained from the reading line 14a and the voltage value obtained from the reference line RL, as a logical value.

Thereafter, at time t6, the semiconductor storage device 1 causes the switches 120a and 120b to be in the connected state, and at the same time, causes the 1/N switch 13a and the replica switches 13b and 13c in the connected state to be in the disconnected state. Further, at time t7, the semiconductor storage device 1 restores the selected row selection line WL to a low level. By this series of operations, the semiconductor storage device 1 can read desired data from the storage element 20a.

Figure 4:
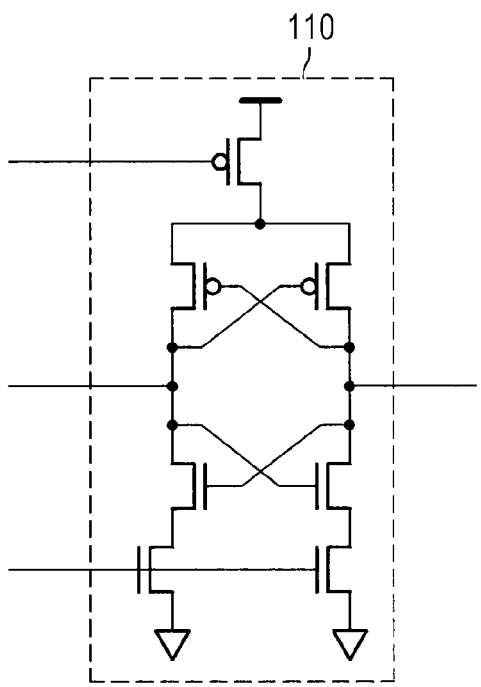
FIG. 4 is an explanatory diagram illustrating a modified example of a cross-coupled inverter.
Figure 5:
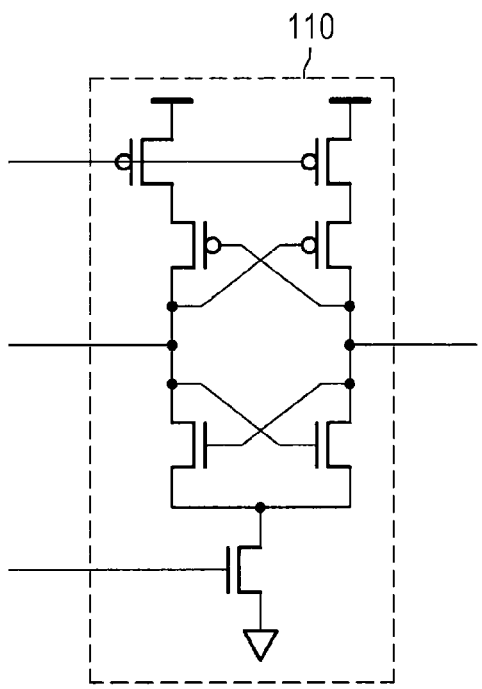
FIG. 5 is an explanatory diagram illustrating a modified example of a cross-coupled inverter.

In the timing chart illustrated in FIG. 3, since an initial level of an inside of the sense amplifier 100 is a high level at the time of reading data, the P-type transistors Tr1 and Tr2 of the cross latch portion are initially in an OFF state. Accordingly, the sources of the P-type transistors Tr1 and Tr2 are not made independent and it is possible to decrease the number of P-type transistors. On the contrary, in a case where the initial level of the inside of the sense amplifier 100 is a low level, it is possible to decrease the number of N-type transistors Tr3 and Tr4 of the cross latch portion. FIGS. 4 and 5 are explanatory diagrams illustrating modified examples of the cross-coupled inverter 110. FIG. 4 is a modified example of the cross-coupled inverter 110 including only one P-type transistor, and FIG. 5 is a modified example of the cross-coupled inverter 110 including only one N-type transistor.

Figure 6:
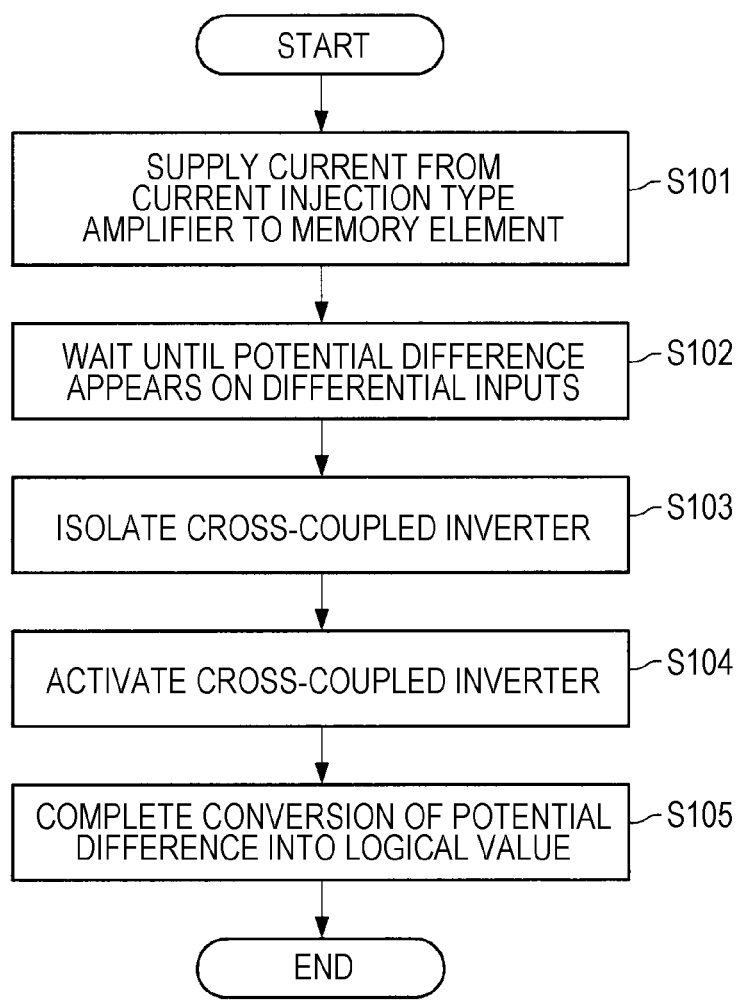
FIG. 6 is a flowchart for describing an example of an operation of the semiconductor storage device according to the embodiment.

Next, an example of an operation of the semiconductor storage device 1 according to the embodiment of the present disclosure will be described. FIG. 6 is a flowchart illustrating the example of the operation of the semiconductor storage device 1 according to the embodiment of the present disclosure. FIG. 6 illustrates an example of an operation of the semiconductor storage device 1 at the time of reading data stored in the storage element 20a. Hereinafter, the example of the operation of the semiconductor storage device 1 according to the embodiment of the present disclosure will be described with reference to FIG. 6.

The semiconductor storage device 1 causes the row selection line WL and the 1/N switch 13a to be in the connected state to select a desired storage element 20a and supply a current from the current injection type amplifier 10a to the desired storage element 20a (step S101). At this time, the semiconductor storage device 1 also supplies a current from the current injection type amplifiers 10b and 10c to the storage elements 20b and 20c for reference.

Then, the semiconductor storage device 1 waits until a potential difference between a potential appearing on the sense node SN due to the supply of the current to the storage element 20a, and a potential appearing on the reference node RN due to the supply of the current to the storage elements 20b and 20c appears on differential inputs to the sense amplifier 100 (step S102).

Then, the semiconductor storage device 1 turns off the switches 120a and 120b to isolate the cross-coupled inverter 110 of the sense amplifier 100 from the reading line 14a and the reference line RL (step S103).

Then, the semiconductor storage device 1 supplies a start signal to the cross-coupled inverter 110 to activate the cross-coupled inverter 110, thereby amplifying the potential difference between the potential appearing on the sense node SN and the potential appearing on the reference node RN (step S104).

Then, the semiconductor storage device 1 converts the potential difference into a logical value of 0 or 1 to complete the reading of the data stored in the storage element 20a (step S105).

The semiconductor storage device 1 according to the present embodiment can read data stored in the storage element 20a by performing such a series of operations. Furthermore, the semiconductor storage device 1 according to the present embodiment includes the cross-coupled inverter 110 illustrated in FIG. 2 and the switches 120a and 120b, such that the plurality of sense amplifiers 100 activated at the same time can share the reference line RL.

Figure 7:
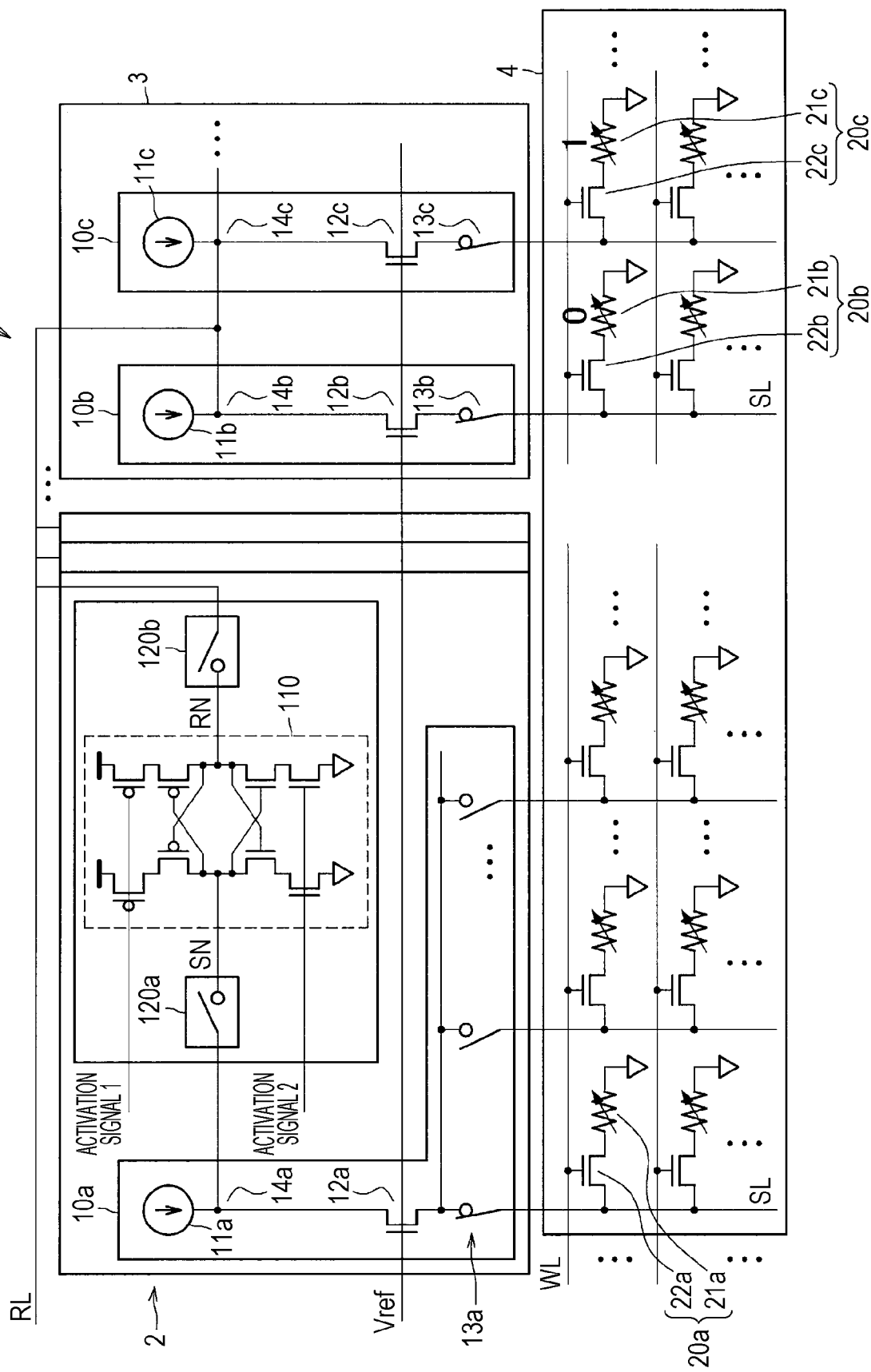
FIG. 7 is an explanatory diagram illustrating an example of a circuit configuration of the semiconductor storage device according to the embodiment.

The storage elements 20b and 20c for reference of the semiconductor storage device 1 according to the present embodiment may be formed in the same array as that of the storage element 20a for data. FIG. 7 is an explanatory diagram illustrating an example of a circuit configuration of the semiconductor storage device 1 according to the present embodiment, and illustrates an example of a circuit configuration in a case where the storage elements 20b and 20c for reference are formed in the same array as that of the storage element 20a for data.

The storage elements 20b and 20c for reference can adopt various configurations. FIGS. 8A to 8F are explanatory diagrams illustrating examples of a configuration of each of the storage elements 20b and 20c for reference. The storage elements 20b and 20c for reference may have a configuration of any one of FIGS. 8A to 8F, or other various configurations.

Figure 8A:
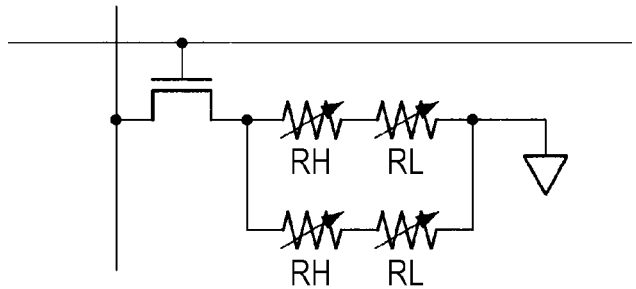
FIG. 8A is an explanatory diagram illustrating an example of a configuration of a storage element for reference.
Figure 8B:
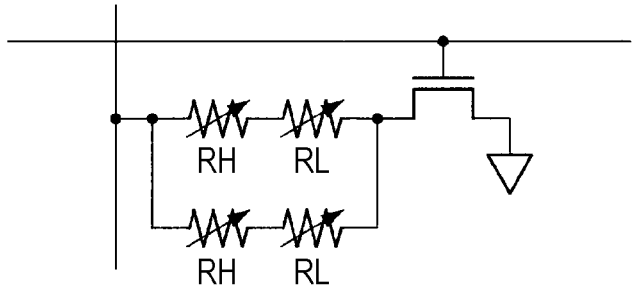
FIG. 8B is an explanatory diagram illustrating an example of a configuration of a storage element for reference.
Figure 8C:
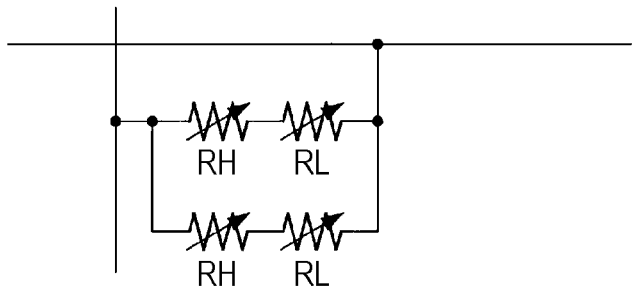
FIG. 8C is an explanatory diagram illustrating an example of a configuration of a storage element for reference.

FIGS. 8A to 8C illustrate examples of a configuration in a case where two sets of two variable-resistance storage elements connected to each other in series are arranged in parallel to each other to generate a reference potential. One of the variable-resistance storage elements connected to each other in series has a high resistance and the other one has a low resistance. Accordingly, two variable-resistance storage elements in a high resistance state and two variable-resistance storage elements in a low resistance state as a whole generate the reference potential. A difference among the configurations illustrated in FIGS. 8A to 8C is a position of the selection transistor or a presence or absence of the selection transistor.

Figure 8D:
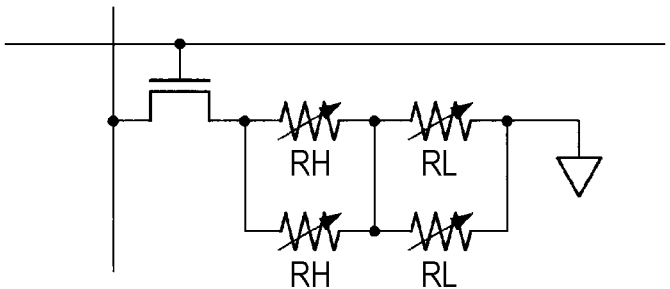
FIG. 8D is an explanatory diagram illustrating an example of a configuration of a storage element for reference.
Figure 8E:
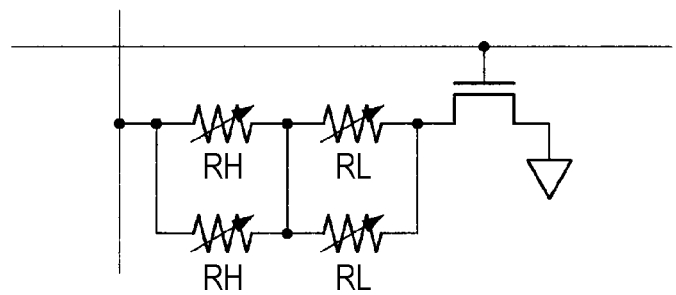
FIG. 8E is an explanatory diagram illustrating an example of a configuration of a storage element for reference.
Figure 8F:
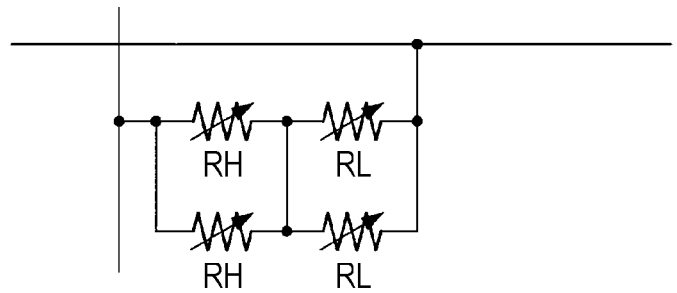
FIG. 8F is an explanatory diagram illustrating an example of a configuration of a storage element for reference.

FIGS. 8D to 8F illustrate examples of a configuration in a case where two sets of two variable-resistance storage elements connected to each other in parallel are connected to each other in series to generate the reference potential. One of the variable-resistance storage elements connected to each other in series has a high resistance and the other one has a low resistance. Accordingly, two variable-resistance storage elements in a high resistance state and two variable-resistance storage elements in a low resistance state as a whole generate the reference potential. A difference among the configurations illustrated in FIGS. 8D to 8F is a position of the selection transistor or a presence or absence of the selection transistor.

The semiconductor storage device 1 according to the present embodiment may sequentially perform the operation on the basis of a read command from the outside. FIG. 9 is an explanatory diagram illustrating an example of a functional configuration of the semiconductor storage device 1 according to the present embodiment. The semiconductor storage device 1 illustrated in FIG. 9 includes a control circuit 50 which outputs an activation control signal, an isolation control signal, and a current injection control signal to the reading circuit 2. The control circuit 50 includes a timing control circuit 51 which receives the read command from the outside and outputs the activation control signal, the isolation control signal, and the current injection control signal to the reading circuit 2. When the read command is received from the outside, the timing control circuit 51 sequentially outputs the activation control signal, the isolation control signal, and the current injection control signal to the reading circuit 2.

2. EXAMPLE OF APPLICATION

Figure 10:
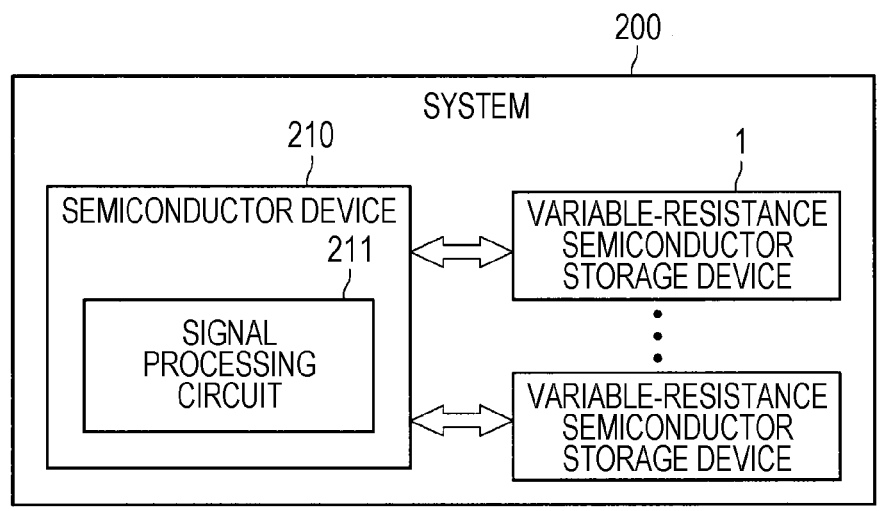
FIG. 10 is an explanatory diagram illustrating an example of a configuration of a system including the semiconductor storage device according to the present embodiment.
Figure 11:
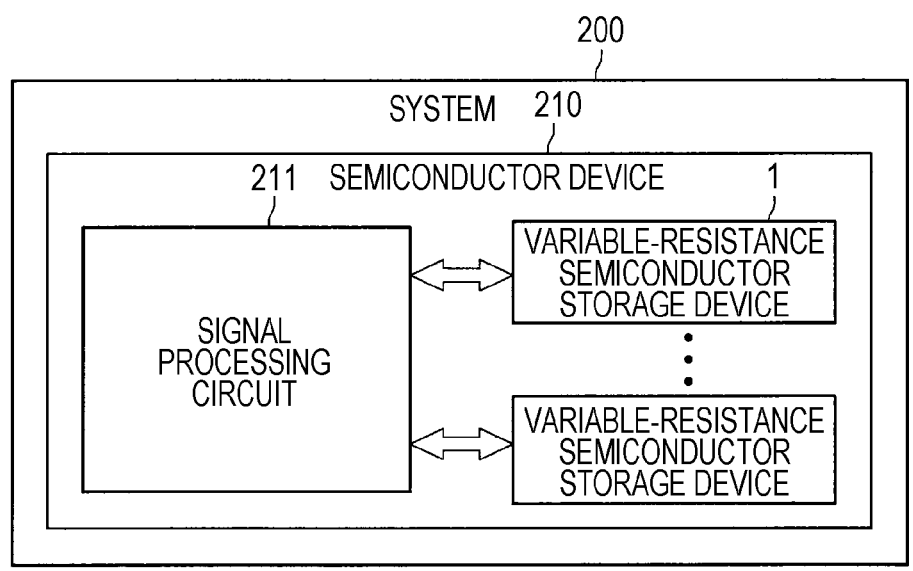
FIG. 11 is an explanatory diagram illustrating an example of a configuration of a system including the semiconductor storage device according to the present embodiment.

One or a plurality of semiconductor storage devices 1 according to the embodiment of the present disclosure may be incorporated into the same semiconductor device as that of a control circuit which controls the semiconductor storage device 1, or may be incorporated into a semiconductor device different from that of the control circuit which controls the semiconductor storage device 1. FIGS. 10 and 11 are explanatory diagrams illustrating examples of a configuration of a system including the semiconductor storage device 1 according to the embodiment of the present disclosure.

The example illustrated in FIG. 10 is an example in which the semiconductor storage device 1 is connected to a semiconductor device 210 including a signal processing circuit 211. The signal processing circuit 211 is a circuit which generates a signal for reading and writing data from and in the semiconductor storage device 1.

Furthermore, the example illustrated in FIG. 11 is an example in which the semiconductor storage device 1 is provided in the semiconductor device 210 including the signal processing circuit 211.

Then, the semiconductor storage device 1 according to the embodiment of the present disclosure can be mounted on various electronic devices. The electronic devices on which the semiconductor storage device 1 according to the embodiment of the present disclosure can be mounted include a smartphone, a table terminal, a digital still camera, a digital video camera, a music player, a set-top box, a computer, a television, a clock, an active speaker, a headset, a game machine, a radio, measuring instrument, an electronic tag, a beacon, and the like.

Figure 12:
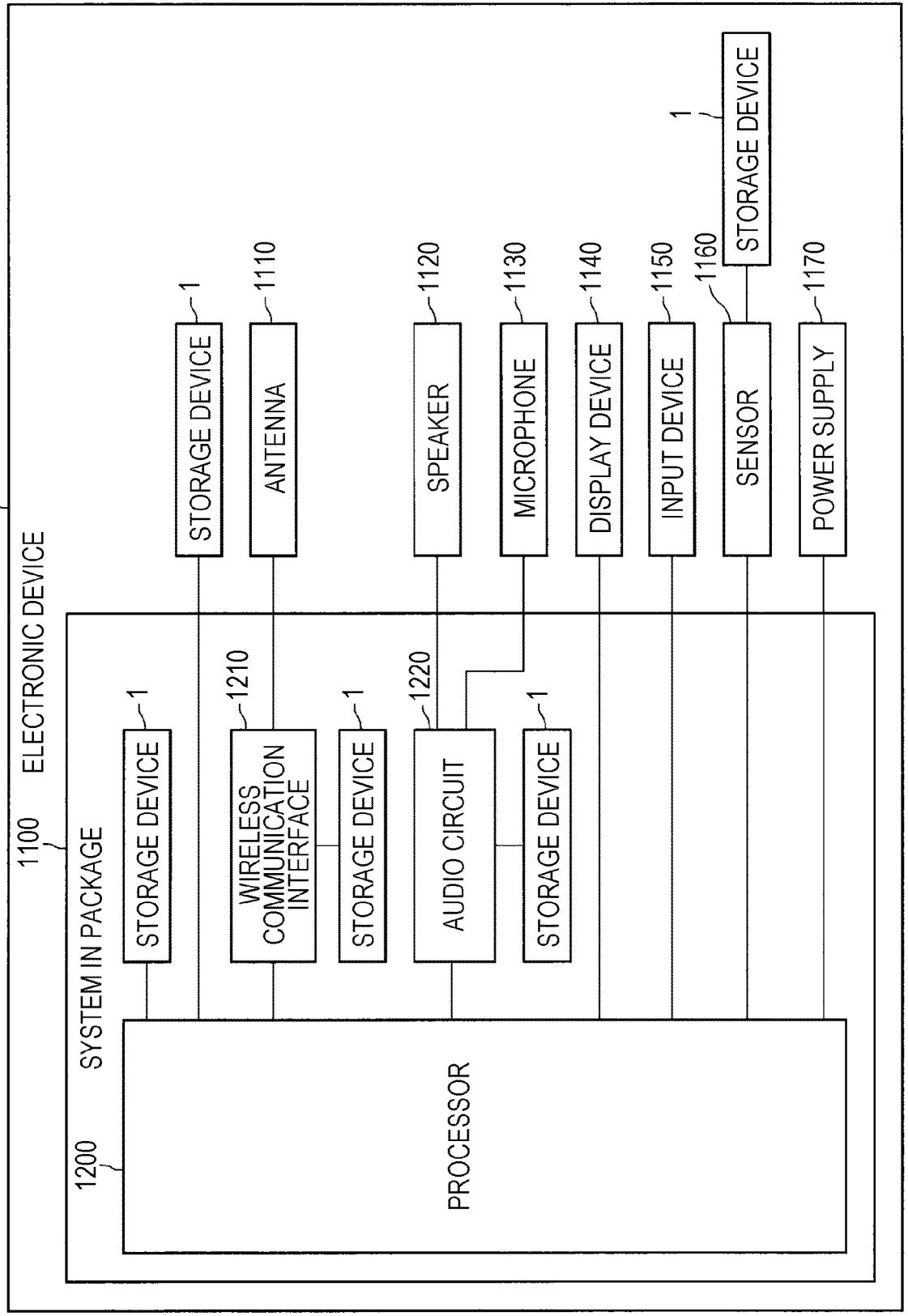
FIG. 12 is an explanatory diagram illustrating an example of a functional configuration of an electronic device on which the semiconductor storage device according to the embodiment can be mounted.

FIG. 12 is an explanatory diagram illustrating an example of a functional configuration of an electronic device 1000 on which the semiconductor storage device 1 according to the embodiment of the present disclosure can be mounted. The electronic device 1000 illustrated in FIG. 12 includes a system in package 1100, an antenna 1110, a speaker 1120, a microphone 1130, a display device 1140, an input device 1150, a sensor 1160, and a power supply 1170. Furthermore, the system in package 1100 includes a processor 1200, a wireless communication interface 1210, and an audio circuit 1220.

The antenna 1110 is an antenna for performing mobile communication, wireless LAN, or short-range communication, and is connected to the wireless communication interface 1210. The speaker 1120 outputs a sound and is connected to the audio circuit 1220. The microphone 1130 collects an ambient sound around the electronic device 1000 and is connected to the audio circuit 1220.

The display device 1140 is configured by, for example, a liquid crystal display, an organic EL display, a light emitting diode (LED) indicator, or the like, and is connected to the processor 1200. The input device 1150 is configured by, for example, a keyboard, a button, a touch panel, or the like, and is connected to the processor 1200.

The sensor 1160 has a function of an optical sensor, a position sensor, an acceleration sensor, a biosensor, a magnetic sensor, a mechanical sensor, a heat sensor, an electric sensor, a chemical sensor, or the like. The variable-resistance semiconductor storage device 1 according to the embodiment of the present disclosure may be connected to the sensor 1160. The power supply 1170 supplies power to the electronic device 1000, and is, for example, a power supply which supplies power from a battery, an AC adaptor, or the like.

The processor 1200 is an electronic circuit for controlling an operation of the electronic device 1000, and the variable-resistance semiconductor storage device 1 according to the embodiment of the present disclosure may be connected inside the system in package 1100 or outside the system in package 1100.

The wireless communication interface 1210 has a function such as the mobile communication, the wireless LAN, or the short range communication. The variable-resistance semiconductor storage device 1 according to the embodiment of the present disclosure may be connected to the wireless communication interface 1210. The audio circuit 1220 has a function of controlling the speaker 1120 and the microphone 1130, and the variable-resistance semiconductor storage device 1 according to the embodiment of the present disclosure may be connected to the audio circuit 1220.

The variable-resistance semiconductor storage device 1 according to the embodiment of the present disclosure, which is capable of implementing a large capacity, a high speed, and an increased data rate, is mounted on such an electronic device 1000, such that it is possible to implement a large storage capacity and a high operation speed.

3. SUMMARY

As described above, according to the embodiment of the present disclosure, there is no need to make load capacities of reading current application paths of the storage element for data storage and the storage element for reference equivalent to each other, and the sense amplifiers 100 which can share the reference line when being activated at the same time and the semiconductor storage device 1 including the sense amplifiers 100 are provided.

In a case of the semiconductor storage device according to the related art, a method of obtaining an average of outputs by connecting a storage element storing a logical value of 0 and a logical value of 1 and a current injection type amplifier to each other in parallel has been suggested for generation of a reference voltage. In order to match up a load of the reference line with a load of the reading line, the same number of reference generating circuits as the number of sense amplifiers are required. Therefore, implementation of a large capacity has been hindered due to a decrease in proportion of valid bits in a memory cell array.

In the sense amplifier 100 according to the embodiment of the present disclosure, since the sources of the transistors of the cross latch portion are independent during the sense period, the charge exchange through the sources of the cross latch portion does not occur during the sense period. Therefore, in the semiconductor storage device 1 according to the embodiment of the present disclosure, there is no need to match up the capacity load of the reading line with the capacity load of the reference line and the plurality of sense amplifiers activated at the same time can share the reference line. Accordingly, in the semiconductor storage device 1 according to the embodiment of the present disclosure, it is possible to decrease the number of reference generating circuits and the number of storage elements for reference.

Since the variable-resistance storage element generally has a resistance value of several kiloohms to several megaohms, a time constant is large and it is thus difficult to implement a high speed operation. Therefore, there is a need to implement a high speed by operating the plurality of sense amplifiers in parallel. Furthermore, since the storage element for reference has the same variation as that of the storage element for data, there is a need to decrease an influence of a variation of the reference voltage through averaging of more than two storage elements for reference when implementing a large capacity. When the number of storage elements for reference is increased, the number of current injection type amplifiers is also increased, and thus there is a need to mitigate the influence by mounting a relatively larger number of sense amplifiers.

In the related art, a high speed has been implemented by matching up loads of two inputs of the sense amplifier with each other. However, since the sense amplifier is designed as small as possible, a transient phenomenon at the time of reading is mainly affected by the time constant depending on a resistance and a capacity of the storage element and a wiring of the memory cell array, and the fact that the loads of the sense amplifiers 100 of the present embodiment are not matched up does not affect a transient time up to generation of the potential difference. Furthermore, the load is isolated from the switch at the time of sensing the potential difference, and thus the sense amplifier 100 of the present embodiment can perform the operation at a higher speed in comparison to the sense amplifier according to the related art.

Furthermore, in a case where the storage element for reference is shared by the sense amplifiers, there is a need to exclusively control the sense amplifiers sharing the storage element for reference in order to match up loads of the differential inputs. However, the semiconductor storage device 1 according to the present embodiment can activate the sense amplifiers 100 sharing the storage element for reference at the same time, such that it is possible to decrease an area to decrease a bit unit price and it is also possible to increase a band width due to parallel reading to increase a data rate.

The semiconductor storage device 1 according to the embodiment of the present disclosure can be a variable-resistance semiconductor storage device, for example, a spin-random access memory (spin-RAM).

Hereinabove, the preferred embodiment of the present disclosure has been described in detail with reference to the accompanying drawings, but the technical scope of the present disclosure is not limited to such examples. It is obvious that those having ordinary knowledge in the technical field of the present disclosure can conceive of various modifications or alterations within the scope of the technical idea described in the claims, and it is understood that the modifications or alterations naturally fall within the technical scope of the present disclosure.

Furthermore, the effects described in the present specification are merely illustrative or exemplary, and not limiting. That is, the technology according to the present disclosure may achieve other effects apparent to those skilled in the art from the description of the present specification, in addition to or instead of the effects described above.

Note that the following configurations also fall within the technical scope of the present disclosure.

(1)

A sense amplifier including:

first and second inverters including switches configured to control an activation state and an inactivation state, and having inputs and outputs cross-coupled to each other, respectively; and first and second switches configured to switch between connection and disconnection of each of the cross-coupled first and second inverters with respect to an input from a storage element.

(2)

The sense amplifier according to (1), in which the first and second inverters are activated after a predetermined time elapses from when the first and second switches are switched from a connected state to a disconnected state.

(3)

The sense amplifier according to (1) or (2), in which the first inverter includes four N-type transistors and the second inverter includes four P-type transistors.

(4)

The sense amplifier according to (1) or (2), in which the first inverter includes two N-type transistors and the second inverter includes four P-type transistors.

(5)

The sense amplifier according to (1) or (2), in which the first inverter includes four N-type transistors and the second inverter includes two P-type transistors.

(6)

A semiconductor storage device including:

a memory element;

a first reference element set to be in a first resistance state when generating a reference potential used to read data from the memory element;

a second reference element set to be in a second resistance state when generating the reference potential, the second resistance state being different from the first resistance state and the second reference element being different from the first reference element; and a sense amplifier configured to detect a difference between inputs from the memory element, and the first and second reference elements which are selected, in which the sense amplifier includes first and second inverters including switches configured to control an activation state and an inactivation state, and having inputs and outputs cross-coupled to each other, respectively; and first and second switches configured to switch between connection and disconnection of each of the cross-coupled first and second inverters with respect to the inputs from the memory element and the first and second reference elements.

(7)

The semiconductor storage device according to (6), further including:

a first current injection type amplifier configured to supply a current to the selected memory element to amplify an output from the memory element;

a second current injection type amplifier configured to supply a current to the selected first reference element to amplify an output from the memory element; and a third current injection type amplifier configured to supply a current to the selected second reference element to amplify an output from the memory element.

(8)

The semiconductor storage device according to (7), further including:

a third switch configured to switch between connection and disconnection between the first current injection type amplifier and the selected memory element;

a fourth switch configured to switch between connection and disconnection between the second current injection type amplifier and the selected first reference element; and a fifth switch configured to switch between connection and disconnection between the third current injection type amplifier and the selected second reference element.

(9)

The semiconductor storage device according to (8), in which the first switch and the second switch are switched from a connected state to a disconnected state after a predetermined time elapses from when the third switch, the fourth switch, and the fifth switch are switched from a disconnected state to a connected state.

(10)

The semiconductor storage device according to any one of (6) to (9), in which the memory element includes a variable-resistance memory element.

(11)

The semiconductor storage device according to any one of (6) to (10), in which the memory element includes a variable-reluctance memory element.

(12)

An information processing apparatus including at least one semiconductor storage device according to any one of (6) to (11).

(13)

A reading method including: switching between connection and disconnection of each of first and second inverters with respect to an input from a storage element by using first and second switches, the first and second inverters including switches configured to control an activation state and an inactivation state, and having inputs and outputs cross-coupled to each other, respectively.

REFERENCE SIGNS LIST

1 Semiconductor storage device
2 Reading circuit
3 Reference generating circuit
4 Memory cell array 5 Reference cell array
100 Sense amplifier
110 Cross-coupled inverter
120a Switch
120b Switch
RL Reference line
RN Reference node
SL Source line
SN Sense node
Vref Reference voltage
WL Word line

The invention claimed is:

1. A sense amplifier comprising:
   first and second inverters including activation switches configured to control an activation state and an inactivation state of the first and second inverters, and having inputs and outputs cross-coupled to each other, respectively;
   a first isolation switch configured to switch between connection and disconnection of each of the cross-coupled first and second inverters with respect to an input from a storage element; and
   a second isolation switch configured to switch between connection and disconnection of each of the cross-coupled first and second inverters with respect to an input from a reference element.

2. The sense amplifier according to claim 1, wherein the first and second inverters are activated after a predetermined time elapses from when the first and second isolation switches are switched from a connected state to a disconnected state.

3. The sense amplifier according to claim 1, wherein the first inverter includes four N-type transistors and the second inverter includes four P-type transistors.

4. The sense amplifier according to claim 1, wherein the first inverter includes two N-type transistors and the second inverter includes four P-type transistors.

5. The sense amplifier according to claim 1, wherein the first inverter includes four N-type transistors and the second inverter includes two P-type transistors.

6. A semiconductor storage device comprising:
   a memory element;
   a first reference element set to be in a first resistance state when generating a reference potential used to read data from the memory element;
   a second reference element set to be in a second resistance state when generating the reference potential, the second resistance state being different from the first resistance state, the second reference element being different from the first reference element; and
   a sense amplifier configured to detect a difference between inputs from the memory element which is selected and the first and second reference elements which are selected, wherein the sense amplifier includes
      first and second inverters including activation switches configured to control an activation state and an inactivation state of the first and second inverters, and having inputs and outputs cross-coupled to each other, respectively;
      a first isolation switch configured to switch between connection and disconnection of each of the cross-coupled first and second inverters with respect to the input from the memory element; and
      a second isolation switch configured to switch because connection and disconnection of each of the cross-coupled first and second inverters with respect to the input from the first and second reference elements.

7. The semiconductor storage device according to claim 6, further comprising:
   a first current injection type amplifier configured to supply a current to the selected memory element to amplify an output from the memory element;
   a second current injection type amplifier configured to supply a current to the selected first reference element to amplify an output from the memory element; and
   a third current injection type amplifier configured to supply a current to the selected second reference element to amplify an output from the memory element.

8. The semiconductor storage device according to claim 7, further comprising:
   a third switch configured to switch between connection and disconnection between the first current injection type amplifier and the selected memory element;
   a fourth switch configured to switch between connection and disconnection between the second current injection type amplifier and the selected first reference element; and
   a fifth switch configured to switch between connection and disconnection between the third current injection type amplifier and the selected second reference element.

9. The semiconductor storage device according to claim 8, wherein the first isolation switch and the second isolation switch are switched from a connected state to a disconnected state after a predetermined time elapses from when the third switch, the fourth switch, and the fifth switch are switched from a disconnected state to a connected state.

10. The semiconductor storage device according to claim 6, wherein the memory element includes a variable-resistance memory element.

11. The semiconductor storage device according to claim 6, wherein the memory element includes a variable-reluctance memory element.

12. An information processing apparatus comprising at least one semiconductor storage device according to claim 6.

13. A reading method comprising:
   switching between connection and disconnection of each of first and second inverters with respect to an input from a storage element by using a first isolation switch;
   switching between connection and disconnected of each of first and second inverters with respect to an input from a reference element by using a second isolation switch,
   wherein the first and second inverters including activation switches configured to control an activation state and an inactivation state of the first and second inverters; and having inputs and outputs cross-coupled to each other, respectively.

14. The information processing apparatus according to claim 12, further comprising:
   a first current injection type amplifier configured to supply a current to the selected memory element to amplify an output from the memory element;
   a second current injection type amplifier configured to supply a current to the selected first reference element to amplify an output from the memory element; and
   a third current injection type amplifier configured to supply a current to the selected second reference element to amplify an output from the memory element.

15. The information processing apparatus according to claim 14, further comprising:

a third switch configured to switch between connection and disconnection between the first current injection type amplifier and the selected memory element;

a fourth switch configured to switch between connection and disconnection between the second current injection type amplifier and the selected first reference element; and a fifth switch configured to switch between connection and disconnection between the third current injection type amplifier and the selected second reference element.

16. The information processing apparatus according to claim 15, wherein the first isolation switch and the second isolation switch are switched from a connected state to a disconnected state after a predetermined time elapses from when the third switch, the fourth switch, and the fifth switch are switched from a disconnected state to a connected state.

17. The information processing apparatus according to claim 12, wherein the memory element includes a variable-resistance memory element.

18. The information processing apparatus according to claim 12, wherein the memory element includes a variable-reluctance memory element.

* * * * *